United States Patent [19]
Shiotsuka

[11] Patent Number: 5,945,822
[45] Date of Patent: Aug. 31, 1999

[54] PROGRAMMABLE LOAD CIRCUIT

[75] Inventor: Hiroyuki Shiotsuka, Tokyo, Japan

[73] Assignee: Advantest Corporation, Japan

[21] Appl. No.: 08/923,368

[22] Filed: Sep. 3, 1997

[30] Foreign Application Priority Data

Sep. 5, 1996 [JP] Japan ................................. 8-235294

[51] Int. Cl.⁶ ............................................. G01R 31/22
[52] U.S. Cl. .................................. 324/158.1; 324/73.1
[58] Field of Search ............................. 324/73.1, 158.1, 324/765, 760; 714/724, 25

[56] References Cited

U.S. PATENT DOCUMENTS

5,200,696  4/1993  Menis et al. .................. 324/158.1
5,266,894  11/1993  Takagi et al. ..................... 324/765
5,276,355  1/1994  Nagata ............................. 307/80
5,521,493  5/1996  Persons ......................... 324/158.1

*Primary Examiner*—Josie Ballato
*Assistant Examiner*—Minh Tang

[57] ABSTRACT

A programmable load circuit is constructed from two current sources that serve as loads of a device under test, a diode bridge to which is impressed a threshold voltage for selecting the load and which is connected to the input/output pins of the device under test, a first switch and a second switch for connecting to the diode bridge the appropriate current source according to output of the device under test, two constant-voltage sources for charging and discharging parasitic capacitance of the diode bridge, and a third switch and a fourth switch that connect the constant-voltage sources and the diode bridge when the device under test is in a signal-inputting state.

7 Claims, 6 Drawing Sheets

PROGRAMMABLE LOAD CIRCUIT

BACKGROUND OF THE INVENTION

1. Field of the Invention

The present invention relates to a semiconductor testing equipment for testing semiconductor devices, and particularly to a programmable load circuit that serves as the load of a device under test.

2. Description of the Related Art

Electronic circuits which are used exclusively for testing of input/output pins of a device under test (hereinbelow referred as "DUT") and which are provided on the test head of semiconductor testing devices are referred to as "pin electronics." Pin electronics comprise a driver for impressing a prescribed signal to the pin of a DUT, a comparator for judging whether the signal outputted from the DUT is high level or low level, and a programmable load circuit that becomes the load when a signal is outputted from the DUT.

Programmable load circuits allow alteration of the load conditions by means of a processing device that controls the entire semiconductor testing device, and can produce the load prescribed in the specifications of a DUT.

Figure 1:
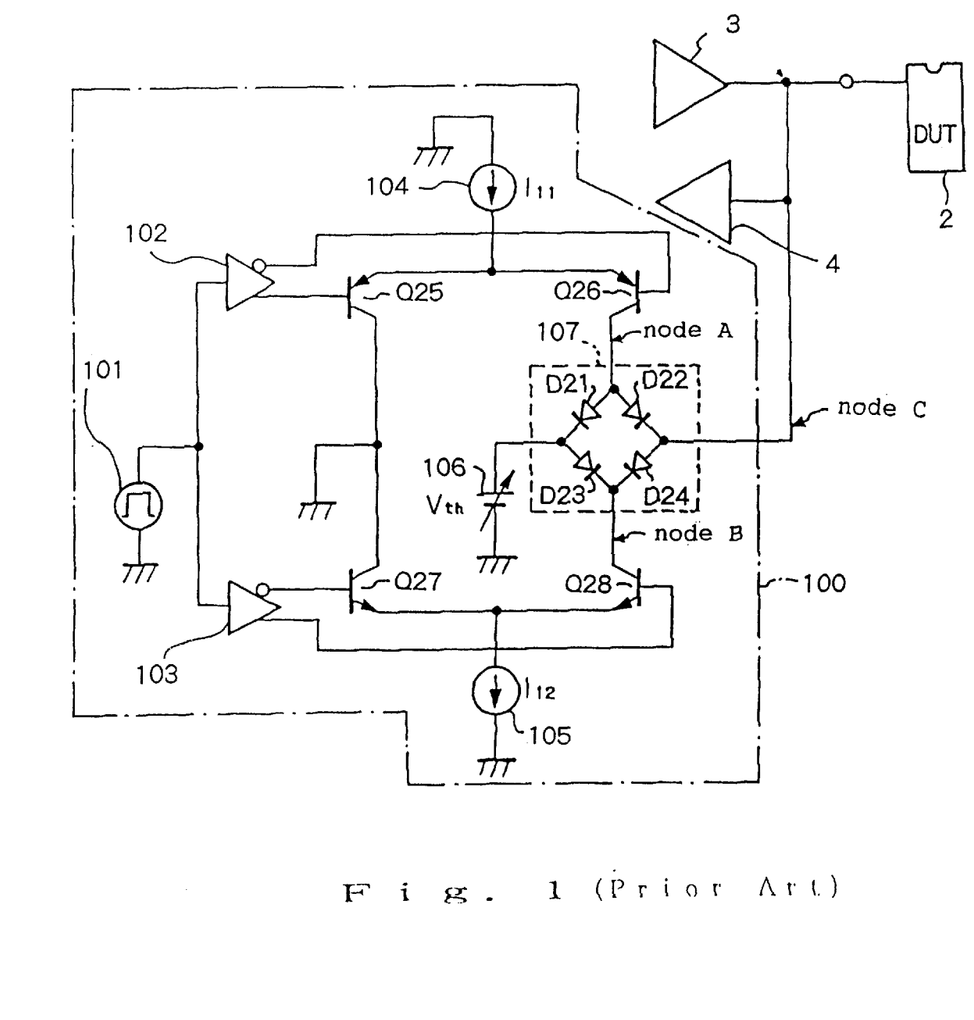
FIG. 1 is a circuit diagram showing the configuration of a programmable load circuit of the prior art.

FIG. 1 shows the circuits making up a programmable load circuit of the prior art.

In FIG. 1, the pin electronics are made up of driver 3, comparator 4, and programmable load circuit 100, to which DUT 2 is connected to perform testing.

Programmable load circuit 100 includes: diode bridge 107 made up of four diodes D21–D24; first current source 104 and second current source 105 that serve as loads of the DUT; programmable voltage source 106 that impresses to diode bridge 107 a threshold voltage Vth used for judgment when selecting one of first current source 104 and second current source 105, which are the loads; transistors Q25–Q28 that serve as switches connecting first current source 104 and second current source 105 to diode bridge 107 or to the ground potential; ON/OFF signal source 101 that outputs a signal for effecting ON/OFF control of programmable load circuit 100; and first level-shift circuit 102 and second level-shift circuit 103 that drive transistors Q25–Q28 according to the output signal of ON/OFF signal source 101.

The ON state of programmable load circuit 100 is the state in which DUT 2 is connected to first current source 104 and second current source 105, which are the loads, and the OFF state of programmable load circuit 100 is the state in which first current source 104 and second current source 105 are each connected to the ground potential and load is not connected to DUT 2.

Here, output voltage Vth of programmable voltage source 106, output current $I_{11}$ of first current source 104, and output current $I_{12}$ of second current source 105 can each be individually changed and set to a prescribed value by a programming process.

The operation of a prior-art programmable load circuit of this configuration will next be explained based on FIG. 2 with reference to FIG. 1.

In addition, the explanation of operation will be based on the following conditions:

1: Output voltage of DUT 2; low level=0 V, high level=3 V
2: Output voltage of driver 3; low level=0 V, high level=3 V
3: Threshold voltage Vth=1.5 V
4: Forward voltage of diodes D21–D24 $V_F$=0.7 V Under the above-described conditions, when a signal is outputted from DUT 2, the output of driver 3 is maintained in a high-impedance (HiZ) state and programmable load circuit 100 is set to ON. The ON/OFF control of programmable circuit 100 is effected by the output signal of ON/OFF signal source 101, and programmable load circuit 100 turns ON when a high-level signal is outputted from ON/OFF signal source 101.

When a high-level signal is outputted from ON/OFF signal source 101, first level-shift circuit 102 supplies a base current only to transistor Q26, and second level-shift circuit 103 supplies a base current only to transistor Q28. At this time, both transistors Q26 and Q28 are ON, and both transistors Q25 and Q27 are OFF.

If a high level (3 V) is outputted from DUT 2 in this state, current $I_{12}$ flows from DUT 2 to second current source 105 by way of diode D24, because the output voltage of DUT 2 is a higher voltage than threshold voltage Vth (1.5 V). On the other hand, if a low level (0 V) is outputted from DUT 2, current $I_{11}$ flows from first current source 104 to DUT 2 via diode D22 because the output voltage of DUT 2 is a lower voltage than threshold voltage Vth (1.5 V).

Thus, load connected to the output of DUT 2 is switched in accordance with its output voltage, and the load value is determined by current value $I_{11}$ of first current source 104 and current value $I_{12}$ of second current source 105.

Moreover, as explained hereinabove, because the output value of each of programmable voltage source 106, first current source 104, and second current source 105 can be changed by a programming process, current values $I_{11}$ and $I_{12}$, which become load, can be changed in accordance with the specifications of DUT 2.

On the other hand, when a signal is not outputted from DUT 2, i.e., in a case in which DUT 2 is in a signal-inputting state, a signal is outputted from driver 3 to DUT 2 and the output of DUT 2 is set to a high-impedance state (HiZ). In addition, because load need not be connected, programmable load circuit 100 is set to OFF.

Programmable load circuit 100 turns OFF in a case in which a low-level signal is outputted from ON/OFF signal source 101. When a low-level signal is outputted from ON/OFF signal source 101, first level-shift circuit 102 supplies a base current only to transistor Q25 and second level-shift circuit 103 supplies a base current only to transistor Q27. At this time, both transistors Q25 and Q27 turn ON and both transistors Q26 and Q28 turn OFF.

When both transistors Q25 and Q27 are ON, first current source 104 is connected to the ground potential by way of transistor Q25, and second current source 105 is connected to the ground potential by way of transistor Q27. As a result, first current source 104 and second current source 105 do not function as load of DUT 2.

Figure 2:
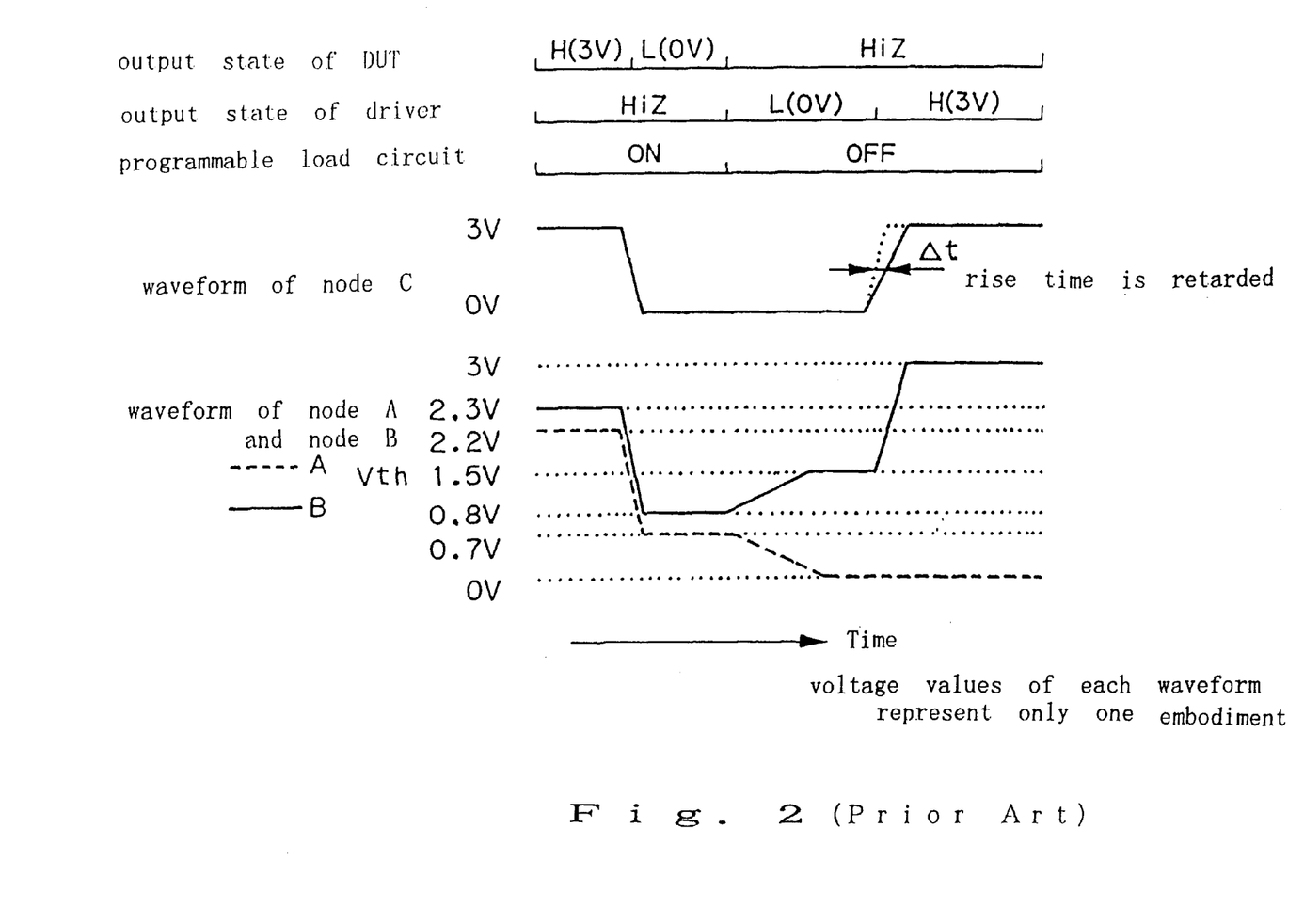
FIG. 2 is a timing chart illustrating the operation of the programmable load circuit shown in FIG. 1.

However, when programmable load circuit 100 is switched from ON to OFF, transistors Q26 and Q28 switch from ON to OFF, whereby, as shown in FIG. 2, the voltage of node A is discharged at a time constant due to the parasitic capacitance held in diodes D21 and D22 and transistor Q26 and changes to 0 V; and the voltage of node B is charged at time constant due to the parasitic capacitance held in diodes D23 and D24 and transistor Q28 and changes to threshold voltage Vth (1.5 V).

Subsequently, when the output signal of driver 3 switches from the low level (0 V) to the high level (3 V), the voltage of node B is pulled toward the voltage of node C and changes from threshold voltage Vth (1.5 V) to 3 V, while node A is maintained at 0 V.

In a programmable load circuit of the prior art as described hereinabove, there is the drawback that when the DUT is driven by the driver, the rise time of the output current is retarded by the programmable load circuit.

Even if the programmable load circuit is OFF, the output of the driver is still connected to the diode bridge of the programmable load circuit. Moreover, the parasitic capacitance existing in each of node A and node B becomes load of driver.

As an example, when the programmable load circuit is OFF and the output of the driver is switched from low level=0 V to high level=3 V, the parasitic capacitance of node B is charged, and as a result, the rise time of the output waveform of the driver (node C) is retarded by a time Dt, as shown in the timing chart of FIG. 2.

SUMMARY OF THE INVENTION

The object of the present invention is to provide a programmable load circuit which has higher driver circuit speed and improved timing accuracy by reducing the influence of parasitic capacitance upon the driver circuit.

To achieve the above-described objects, the programmable load circuit of the present invention of this invention:

is a programmable load circuit that is provided in a semiconductor testing equipment and that becomes the load during output of a device under test including:

a first current source;

a second current source;

a diode bridge to which is impressed a threshold voltage for selecting either one of the first current source or the second current source as load, and which is connected to input/output pins of the device under test;

a first switch that connects the first current source and the diode bridge;

a second switch that connects the second current source and the diode bridge;

a first constant-voltage source for discharging electric charge accumulated in the parasitic capacitance of the first node, which is the connecting portion of the diode bridge and the first switch;

a second constant-voltage source for charging the parasitic capacitance of the second node, which is the connecting portion of the diode bridge and the second switch;

a third switch that connects the first constant-voltage source and the first node;

a fourth switch that connects the second constant-voltage source and the second node; and a control circuit which, when a signal is outputted from the device under test, turns ON the first switch and the second switch and turns OFF the third switch and the fourth switch and, when the device under test is in a signal-inputting state, turns OFF the first switch and the second switch and turns ON the third switch and the fourth switch.

the third switch may be constituted by a first diode for clamping the voltage of the first node at the voltage of the first constant-voltage source; and the fourth switch may be constituted by a second diode for clamping the voltage of the second node at the voltage of the second-constant-voltage source.

In this case, the control circuit may be constituted by:

a third current source for pulling in the voltage of the second node to the output voltage of the second constant-voltage source when the device under test is in a signal-inputting state;

a fourth current source for pulling in the voltage of the first node to the output voltage of the first constant-voltage source when the device under test is in a signal-inputting state;

a first transistor for connecting the third current source to the second node;

a second transistor for connecting the third current source to the ground potential;

a third transistor for connecting the fourth current source to the first node;

a fourth transistor for connecting the fourth current source to the ground potential;

a first level-shift circuit that, when a signal is outputted from the device under test, turns the first transistor OFF and turns the second transistor ON; and when the device under test is in a signal-inputting state, turns the first transistor ON and turns the second transistor OFF; and a second level-shift circuit that, when a signal is outputted from the device under test, turns the third transistor OFF and turns the fourth transistor ON; and when the device under test is in a signal-inputting state, turns the third transistor ON and turns the fourth transistor OFF.

Alternatively, the third switch may be constituted by a first p-channel MOS transistor and a first n-channel MOS transistor, the sources and drains of these two transistors being mutually connected; and the fourth switch may be constituted by a second p-channel MOS transistor and a second n-channel MOS transistor, the sources and drains of these two transistors being mutually connected.

In this case, the control circuit may be provided with:

a first driver circuit, for driving the third switch, provided with: a third p-channel MOS transistor having its source connected to the positive voltage source, its drain connected to the gate of the first n-channel MOS transistor, and its gate connected to the gate of the first p-channel MOS transistor; and a third n-channel MOS transistor having its drain connected to the drain of the third p-channel MOS transistor, its source connected to the negative voltage source, and its gate connected to the gate of the first p-channel MOS transistor;

and a second driver circuit, for driving the fourth switch, provided with a fourth p-channel MOS transistor having its source connected to the positive voltage source, its drain connected to the gate of the second n-channel MOS transistor, and its gate connected to gate of the second p-channel MOS transistor; and a fourth n-channel MOS transistor having its drain connected to the drain of the fourth p-channel MOS transistor, its source connected to the negative voltage source, and its gate connected to the gate of the second p-channel MOS transistor.

Alternatively, the third switch may be constituted by a first diode bridge; and the fourth switch may be constituted by a second diode bridge.

In this case, the control circuit may be provided with:

a first driver circuit, for driving the third switch, provided with: a third current source and a fourth current source that determine the current that flows to the first diode bridge; a first transistor that connects the third current source to the first diode bridge; a second transistor that connects the third current source to the ground potential; a third transistor that connects the fourth current source to the first diode bridge; a fourth transistor that connects the fourth current source to the ground potential; a first level-shift circuit that, when the third switch is turned ON, turns ON the first transistor and turns OFF the second transistor, and when the third switch is turned OFF, turns OFF the first transistor and turns ON the second transistor; a second level-shift circuit that, when the third switch is turned ON, turns ON the third transistor and turns OFF the fourth transistor, and when the third switch is turned OFF, turns OFF the third transistor and turns ON the fourth transistor;

and a second driver circuit, for driving the fourth switch, provided with: a fifth current source and a sixth current source that determine the current that flows to the second diode bridge; a fifth transistor that connects the fifth current source to the second diode bridge; a sixth transistor that connects the fifth current source to the ground potential; a seventh transistor that connects the sixth current source to the second diode bridge; an eighth transistor that connects the sixth current source to the ground potential; a third level-shift circuit that, when the fourth switch is turned ON, turns ON the fifth transistor and turns OFF the sixth transistor, and when the fourth switch is turned OFF, turns OFF the fifth transistor and turns ON the sixth transistor; and a fourth level-shift circuit that, when the fourth switch is turned ON, turns ON the seventh transistor and turns OFF the eighth transistor, and when the fourth switch is turned OFF, turns OFF the seventh transistor and turns ON the eighth transistor.

In the programmable load circuit configured as described hereinabove, when the device under test is in a signal-inputting state, the first constant-voltage source and first node are connected by the third switch, and the voltage of the first node is discharged until it reaches the value of the first constant-voltage source. The second constant-voltage source and the second node are connected by the fourth switch, and the voltage of the second node is charged until it reaches the voltage value of the second constant-voltage source.

As a result, when output of the driver is switched, there is no need to charge and discharge the parasitic capacitance of the first node and the second node.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Embodiments of the present invention will next be explained with reference to the accompanying figures.

Figure 3:
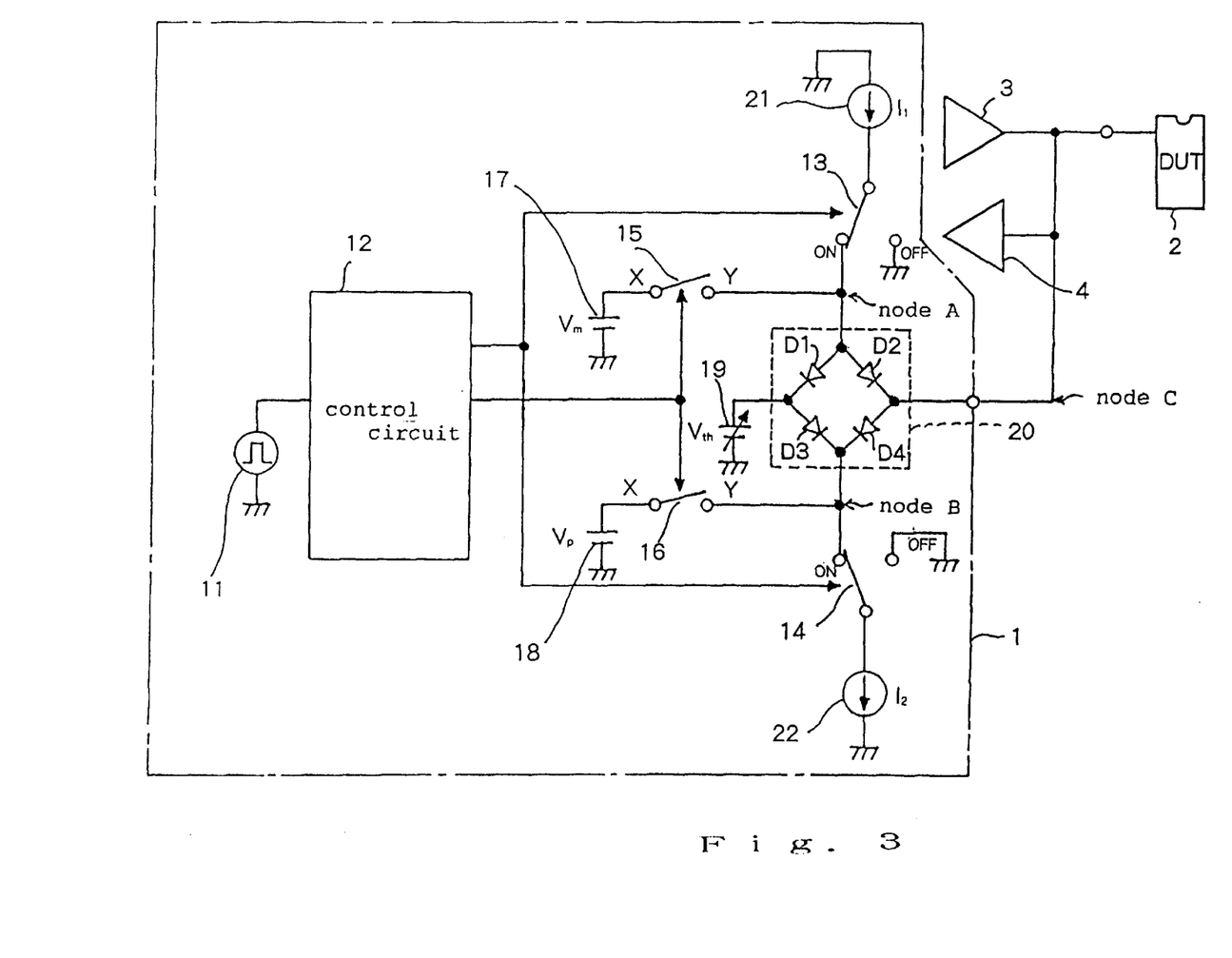
FIG. 3 is a circuit diagram showing the configuration of the programmable load circuit of the present invention.

In FIG. 3, the pin electronics is made up of driver 3, comparator 4, and programmable load circuit 1, and testing is effected by connecting these components to DUT 2.

Programmable load circuit 1 comprises: diode bridge 20 made up of four diodes D1–D4; first current source 21 and second current source 22 that become the load of DUT 2; programmable voltage source 19 for impressing to diode bridge 20 a threshold voltage Vth used for judging when selecting one of first current source 21 and second current source 22, which are the loads; first switch 13 for connecting first current source 21 and diode bridge 20, second switch 14 for connecting second current source 22 and diode bridge 20; first constant-voltage source 17 (a negative voltage source) for discharging electric charge accumulated in the parasitic capacitance of node A when programmable load circuit 1 is OFF; second constant-voltage source 18 (a positive voltage source) for charging the parasitic capacitance of node B when programmable load circuit 1 is OFF; third switch 15 for connecting node A and first constant-voltage source 17; fourth switch 16 for connecting node B and second constant-voltage source 18; control circuit 12 that effects ON/OFF control of each of first switch 13 to fourth switch 16; ON/OFF signal source 11 that outputs a signal for effecting ON/OFF control of programmable load circuit 1.

Here, the ON state of programmable load circuit 1 indicates a state in which first current source 21 and second current source 22, which are the load, are connected to DUT 2; and the OFF state of programmable load circuit 1 indicates a state in which both first current source 21 and second current source 22 are connected to the ground potential and load is not connected to DUT 2.

In this configuration, in a case in which a signal is first outputted from DUT 2, the output of driver 3 is maintained in a high-impedance (HiZ) state and programmable load circuit 1 is turned ON. Programmable load circuit 1 turns ON when a high-level signal is outputted from ON/OFF signal source 11 When a high-level signal is outputted from ON/OFF signal source 11, control circuit 12 turns ON each of first switch 13 and second switch 14, and turns OFF each of third switch 15 and fourth switch 16.

At this time, first current source 21 and second current source 22 are connected to DUT 2 by way of diode bridge 20, and, as in the prior art, either first current source 21 or second current source 22 is connected as appropriate as load in accordance with the output voltage of DUT 2.

On the other hand, in a case in which a signal in not outputted from DUT 2, i.e., when DUT 2 is in signal-inputting state, the output of DUT 2 is set to high-impedance (HiZ) state. Furthermore, because load does not need to be connected, programmable load circuit 1 is set to OFF.

At this time, a low-level signal is outputted from ON/OFF signal source 11, and control circuit 12 turns OFF each of first switch 13 and second switch 14, and turns ON each of third switch 15 and fourth switch 16.

When both third switch 15 and fourth switch 16 are turned ON, first constant-voltage source 17 and node A are connected by way of third switch 15, and electric charge accumulated in the parasitic capacitance of node A is discharged until it reaches the output voltage Vm of first constant-voltage source 17. In addition, second constant-voltage source 18 and node B are connected by way of fourth switch 16, and the parasitic capacitance of node B is charged until it reaches the output voltage Vp of second constant-voltage source 18.

Accordingly, driver 3 does not need to charge or discharge the parasitic capacitance of node A and node B upon switching the output signal. As a result, the rise of the output waveform of driver 3 is faster, the influence caused by the connection of programmable load circuit 1 to output of driver 3 is reduced, and an improvement in timing accuracy can be achieved.

Specifics of the embodiments of the present invention will next be presented.

THE FIRST EMBODIMENT

Explanation will first be presented regarding the first embodiment of the present invention, which is an example of the application of the present invention to the prior-art circuit shown in FIG. 1.

Figure 4:
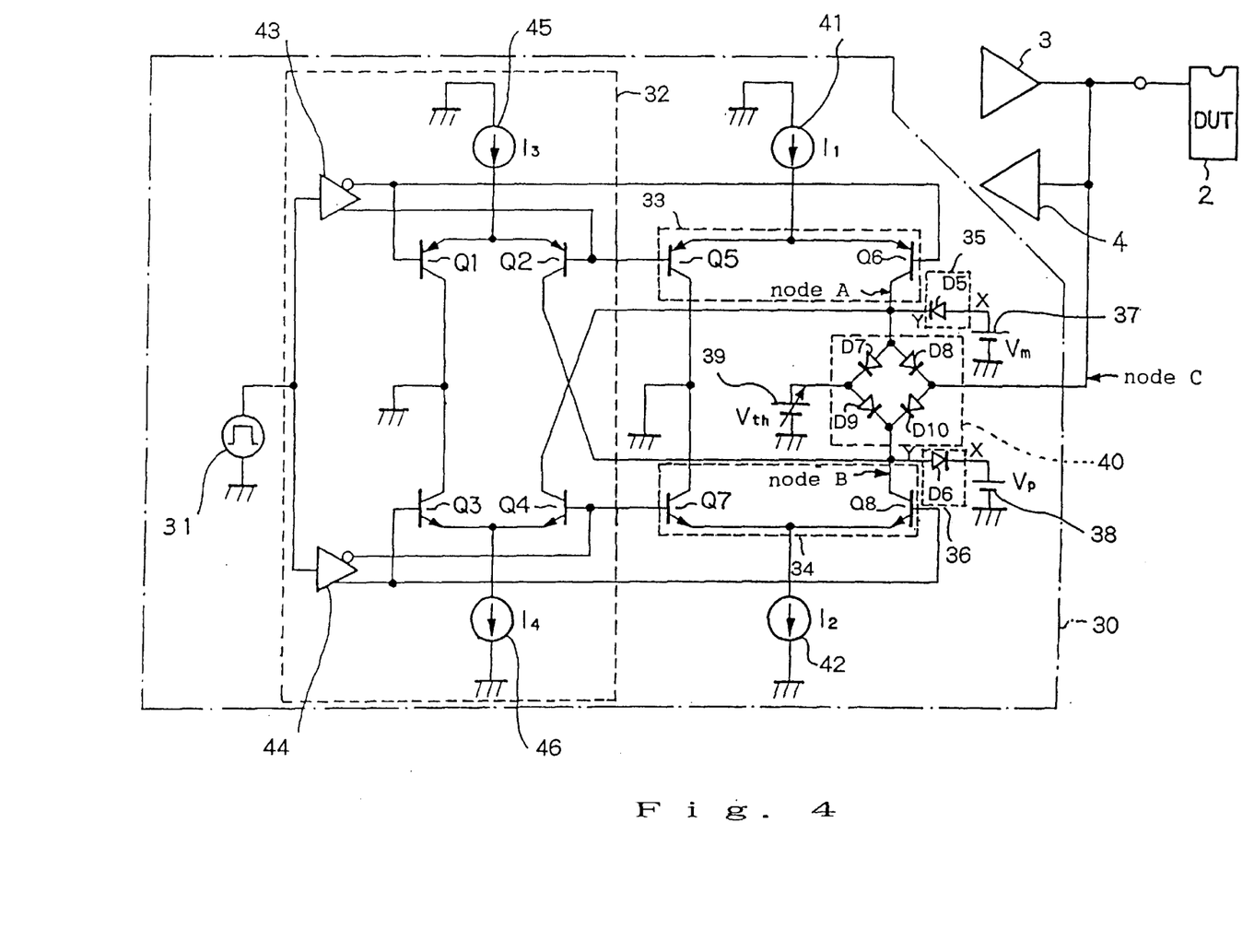
FIG. 4 is a circuit diagram showing the configuration of the first embodiment of the programmable load circuit according to the present invention.

In FIG. 4, programmable load circuit 30 of the present embodiment is constituted by: diode bridge 40 made up of four diodes D7–D10; first current source 41 and second current source 42 that serve as the load of DUT 2; programmable voltage source 39 that impresses to diode bridge 40 a threshold voltage Vth used for judgment when selecting either one of first current source 41 and second current source 42, which serve as the load; transistors Q5 and Q6 that serve as first switch 33 for connecting first current source 41 and diode bridge 40; transistors Q7 and Q8 that serve as second switch 34 for connecting second current source 42 and diode bridge 40; first constant-voltage source 37 (negative voltage source) for discharging node A when programmable load circuit 30 is OFF; second constant-voltage source 38 (positive voltage source) for charging node B when programmable load circuit 30 is OFF; diode D5 that serves as third switch 35 for connecting node A and first constant-voltage source 37; diode D6 that serves as fourth switch 36 for connecting node B and second constant-voltage source 38; control circuit 32 that effects ON/OFF control of each of first switch 33 to fourth switch 36; ON/OFF signal source 31 that generates signal for effecting ON/OFF control of programmable load circuit 30.

Control circuit 32 is made up of fourth current source 46 for pulling in the voltage of node A to the output voltage Vm of first constant-voltage source 37 when programmable load circuit 30 is OFF; third current source 45 for pulling in the voltage of node B to the output voltage Vp of second constant-voltage source 38 when programmable load circuit 30 is OFF; transistors Q1–Q4 that function as switches for switching the current path of third current source 45 and fourth current source 46; and first level-shift circuit 43 and second level-shift circuit 44 that drive transistors Q1–Q8 in accordance with output signals from ON/OFF signal source 31.

Explanation will next be given regarding the operation of programmable load circuit 30 of this configuration of the present embodiment based on FIG. 5 and with reference to FIG. 4.

Figure 5:
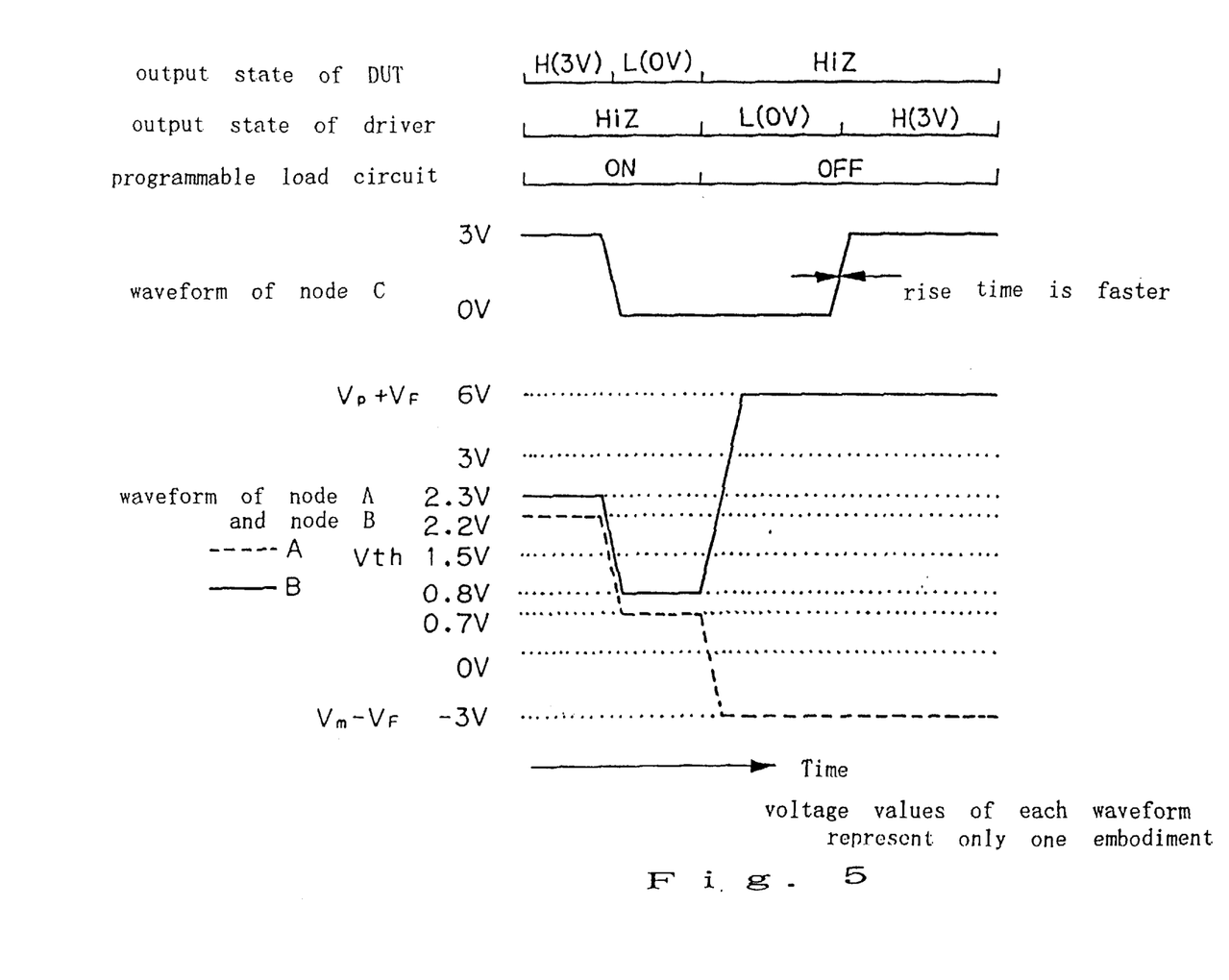
FIG. 5 is a timing chart illustrating the operation of the programmable load circuit shown in FIG. 4.

The voltage values of each waveform shown in FIG. 5 represent only one embodiment, and the present invention is not limited to these voltage values. Here, the output voltage Vm of first constant-voltage source 37 is Vm=−2.3 V and output voltage Vp of second constant-voltage source 38 is Vp=5.3 V.

Programmable load circuit 30 of the present embodiment has the configuration of the programmable load circuit of the prior art shown in FIG. 1 to which are added third current source 45, fourth current source 46, transistors Q1–Q4, first constant-voltage source 37, second constant-voltage source 38, and diodes D5 and D6. The construction is otherwise the same as the prior art, and explanation of the operation of equivalent elements is therefore here omitted.

First, when a signal is outputted from DUT 2, the output of driver 3 is maintained in a high-impedance (HiZ) state and programmable load circuit 30 is set to the ON state. ON/OFF control of programmable load circuit 30 is effected by the output signal of ON/OFF signal source 31, programmable load circuit 30 turning ON when a high-level signal is outputted from ON/OFF signal source 31.

When a high-level signal is outputted from ON/OFF signal source 31, first level-shift circuit 43 supplies a base current only to transistor Q1, and second level-shift circuit 44 supplies a base current only to transistor Q3. Transistors Q1 and Q3 hereupon turn ON and transistors Q2 and Q4 turn OFF.

When transistors Q1 and Q3 turn ON, third current source 45 and fourth current source 46 are each connected to the ground potential by way of transistors Q1 and Q3, and, as in the prior art, programmable load circuit 30 operates by providing first current source 41 and second current source 42 as load.

On the other hand, if a signal is not outputted from DUT 2, i.e., if DUT 2 is in a signal-inputting state, the output of DUT 2 is set to a high-impedance (HiZ) state, and because load does not need to be connected, programmable load circuit 30 is set to OFF.

In this case, a low-level signal is outputted from ON/OFF signal source 31, first level-shift circuit 43 supplies a base current only to transistor Q2 and second level-shift circuit 44 supplies a base current only to transistor Q4, whereupon transistors Q2 and Q4 turn ON and transistors Q1 and Q3 turn OFF.

When transistors Q2 and Q4 turn ON, third current source 45 and node B are connected by way of transistor Q2, and the parasitic capacitance of node B is charged to (output voltage Vp+forward voltage of diode D6 $V_F$=6 V). Fourth current source 46 and node A are connected by way of transistor Q4, and the parasitic capacitance of node A is discharged to (output voltage Vm−forward voltage of diode D5 $V_F$=−3 V).

As a result, as shown in FIG. 5, when the output of driver 3 switches from low to high level, the need to charge or discharge the parasitic capacitance of node A and node B is eliminated.

SECOND EMBODIMENT

The second embodiment of the present invention will next be explained with reference to FIG. 6.

This embodiment presents another example of configuring the third switch and fourth switch.

Figure 6:
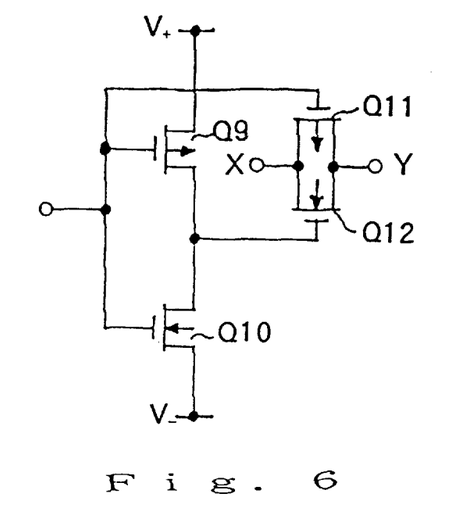
FIG. 6 shows the configuration of second embodiment of the programmable load circuit according to the present invention and is a circuit diagram showing another example of the third switch shown in FIG. 3.

As shown in FIG. 6, the third switch can be constructed from p-channel MOS transistor Q11 and n-channel MOS transistor Q12 having mutually connected drains and sources.

In this case, the third switch is driven by a driver circuit made up of p-channel MOS transistor Q9 and n-channel MOS transistor Q10.

The source of p-channel MOS transistor Q9, which forms part of the driver circuit, is connected to the positive voltage source $V_+$, while the source of n-channel MOS transistor Q10, which forms part of the driver circuit, is connected to the negative voltage source $V_-$. The drain of p-channel MOS transistor Q9 is connected to the drain of n-channel MOS transistor Q10, and these in turn are connected to the gate of the n-channel MOS transistor Q12 that forms part of the third switch. In addition, the gate of p-channel MOS transistor Q11 that makes up part of the third switch, the gate of p-channel MOS transistor Q9, and the gate of n-channel MOS transistor Q10 are all connected together.

In this type of configuration, a negative voltage $V_-$ is impressed to the gates of p-channel MOS transistor Q9 and n-channel MOS transistor Q10 when the third switch is turned ON. If a positive voltage ($V_+$ or less) is then inputted to the X terminal of FIG. 6, a negative voltage $V_-$ is impressed to the gate of p-channel MOS transistor Q11, p-channel MOS transistor Q11 turns ON, and the voltage inputted to the X terminal is outputted without change to the Y terminal. If the voltage inputted to the X terminal is a negative voltage ($V_-$ or more), p-channel MOS transistor Q9 turns ON, a positive voltage $V_+$ is impressed to the gate of n-channel MOS transistor Q12, n-channel MOS transistor Q12 turns ON, and the voltage inputted to the X terminal is outputted without change to the Y terminal.

Conversely, when the third switch is turned OFF, a positive voltage $V_+$ is impressed to the gates of p-channel MOS transistor Q9 and n-channel MOS transistor Q10.

At this time, the Y terminal of FIG. 6 enters a high-impedance state, and the portion between the X terminal and Y terminal of FIG. 6 functions as a switch.

The circuit configuration shown in FIG. 6 may also be adopted as the construction for the fourth switch and its driver circuit, and redundant explanation is therefore here omitted.

The control circuit is constructed from a driver circuit for driving the third switch shown in FIG. 6 and the equivalent fourth switch and from a logic circuit by which the third switch and fourth switch are turned OFF during the time that the first switch and second switch are ON, and the third switch and fourth switch are turned ON during the time that the first switch and second switch are OFF.

THE THIRD EMBODIMENT

Next will be explained the third embodiment of the present invention with reference to FIG. 7. As in the second embodiment, this embodiment also presents another example of configuring the third and fourth switches.

Figure 7:
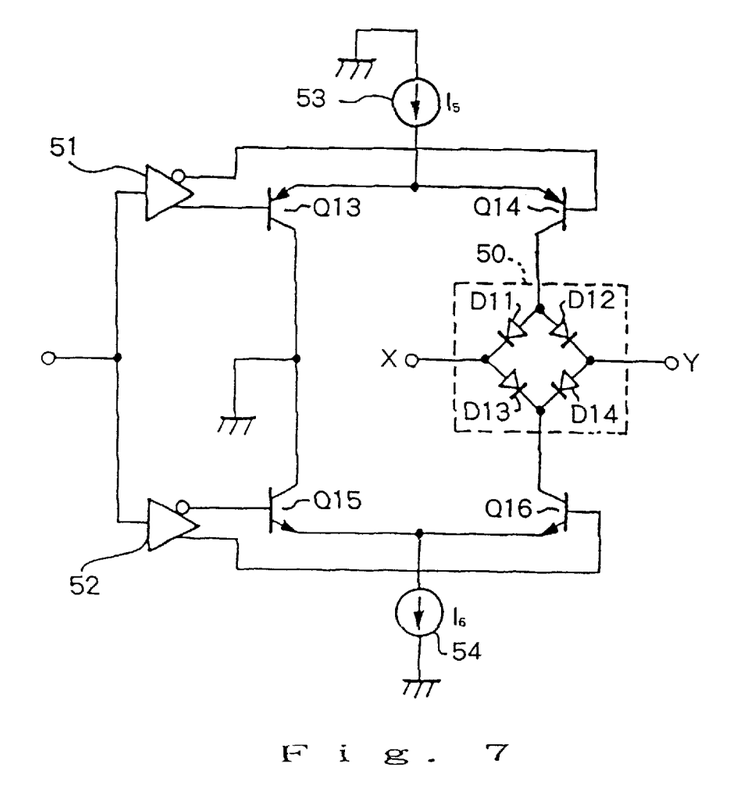
FIG. 7 shows the configuration of the third embodiment of the programmable load circuit according to the present invention and is a circuit diagram showing another example of the third switch shown in FIG. 3.

As shown in FIG. 7, the third switch can be constructed from a diode bridge 50 made up of four diodes D11–D14.

In this case, the driver circuit is made up from fifth current source 53 and sixth current source 54 that determine the current that flows to diode bridge 50; transistor Q14 for connecting fifth current source 53 to diode bridge 50, transistor Q13 for connecting fifth current source 53 to the ground potential; transistor Q16 for connecting sixth current source 54 to diode bridge 50; transistor Q15 for connecting sixth current source 54 to the ground potential; third level-shift circuit 51 that controls transistors Q13 and Q14; and fourth level-shift circuit 52 that controls transistors Q15 and Q16.

With this construction, when the third switch is turned ON, third level-shift circuit 51 causes transistor Q14 to turn ON and transistor Q13 to turn OFF, and fourth level-shift circuit 52 causes transistor Q16 to turn ON and transistor Q15 to turn OFF.

At this time, if current $I_5$ flowing to fifth current source 53 and current $I_6$ flowing to sixth current source 54 are made equal, voltage inputted to the X terminal of FIG. 7 is outputted to the Y terminal without change.

On the other hand, when the third switch is turned OFF, third level-shift circuit 51 causes transistor Q14 to turn OFF and transistor Q13 to turn ON, and fourth level-shift circuit 52 causes transistor Q16 to turn OFF and transistor Q15 to turn ON, whereupon the Y terminal of FIG. 7 enters a high-impedance state, and the portion between the X terminal and Y terminal of FIG. 7 functions as a switch.

The fourth switch and its driver circuit may also be constructed the same as the third switch shown in FIG. 7, and redundant explanation is therefore here omitted.

Finally, the control circuit is made up of a driver circuit for driving each of the third switch shown in FIG. 7 and equivalent fourth switch and a logic circuit by which the third switch and fourth switch are turned OFF during the time the first switch and second switch are ON, and the third switch and fourth switch are turned ON during the time that the first switch and second switch are OFF.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A programmable load circuit that is provided in a semiconductor testing equipment and that becomes load during output of a device under test; comprising:

a first current source;

a second current source;

a diode bridge to which is impressed a threshold voltage for selecting either one of said first current source or said second current source as load, and which is connected to input/output pins of said device under test;

a first switch that connects said first current source to said diode bridge;

a second switch that connects said second current source to said diode bridge;

a first constant-voltage source for discharging electric charge accumulated in parasitic capacitance of a first node, which is the connecting portion of said diode bridge and said first switch;

a second constant-voltage source for charging parasitic capacitance of a second node, which is the connecting portion of said diode bridge and said second switch;

a third switch that connects said first constant-voltage source and said first node;

a fourth switch that connects said second constant-voltage source and said second node; and a control circuit which, when a signal is outputted from said device under test, turns ON said first switch and said second switch and turns OFF said third switch and said fourth switch and, when said device under test is in a signal-inputting state, turns OFF said first switch and said second switch and turns ON said third switch and said fourth switch.

2. A programmable load circuit according to claim 1 wherein:

said third switch comprises a first diode for clamping the voltage of said first node at the voltage of said first constant-voltage source; and said fourth switch comprises a second diode for clamping the voltage of said second node at the voltage of said second-constant-voltage source.

3. A programmable load circuit according to claim 2 wherein:

said control circuit comprises:

a third current source for pulling in the voltage of said second node to the output voltage of said second constant-voltage source when said device under test is in a signal-inputting state;

a fourth current source for pulling in the voltage of said first node to the output voltage of said first constant-voltage source when said device under test is in a signal-inputting state;

a first transistor for connecting said third current source to said second node;

a second transistor for connecting said third current source to ground potential;

a third transistor for connecting said fourth current source to said first node;

a fourth transistor for connecting said fourth current source to ground potential;

a first level-shift circuit that, when a signal is outputted from said device under test, turns said first transistor OFF and turns said second transistor ON; and when said device under test is in a signal-inputting state, turns said first transistor ON and turns said second transistor OFF; and a second level-shift circuit that, when a signal is outputted from said device under test, turns said third transistor OFF and turns said fourth transistor ON; and when said device under test is in a signal-inputting state, turns said third transistor ON and turns said fourth transistor OFF.

4. A programmable load circuit according to claim 1 wherein:

said third switch comprises a first p-channel MOS transistor and a first n-channel MOS transistor, the sources and drains of these two transistors being mutually connected; and said fourth switch comprises a second p-channel MOS transistor and a second n-channel MOS transistor, the sources and drains of these two transistors being mutually connected.

5. A programmable load circuit according to claim 4 wherein:

said control circuit comprises:

a first driver circuit, for driving said third switch, provided with: a third p-channel MOS transistor having its source connected to a positive voltage source, its drain connected to the gate of said first n-channel MOS transistor, and its gate connected to the gate of said first p-channel MOS transistor; and a third n-channel MOS transistor having its drain connected to the drain of said third p-channel MOS transistor, its source connected to a negative voltage source, and its gate connected to the gate of said first p-channel MOS transistor;

and a second driver circuit, for driving said fourth switch, provided with a fourth p-channel MOS transistor having its source connected to a positive voltage source, its drain connected to the gate of said second n-channel MOS transistor, and its gate connected to the gate of said second p-channel MOS transistor; and a fourth n-channel MOS transistor having its drain connected to the drain of said fourth p-channel MOS transistor, its source connected to a negative voltage source, and its gate connected to the gate of said second p-channel MOS transistor.

6. A programmable load circuit according to claim 1 wherein:

said third switch comprises a first diode bridge; and said fourth switch comprises a second diode bridge.

7. A programmable load circuit according to claim 6 wherein:

said control circuit comprises:

a first driver circuit, for driving said third switch, provided with: a third current source and a fourth current source that determine the current that flows to said first diode bridge; a first transistor that connects said third current source to said first diode bridge; a second transistor that connects said third current source to ground potential; a third transistor that connects said fourth current source to said first diode bridge; a fourth transistor that connects said forth current source to ground potential; a first level-shift circuit that, when said third switch is turned ON, turns ON said first transistor and turns OFF said second transistor, and when said third switch is turned OFF, turns OFF said first transistor and turns ON said second transistor; a second level-shift circuit that, when said third switch is turned ON, turns ON said third transistor and turns OFF said fourth transistor, and when said third switch is turned OFF, turns OFF said third transistor and turns ON said fourth transistor;

and a second driver circuit, for driving said fourth switch, provided with: a fifth current source and a sixth current source that determine the current that flows to said second diode bridge; a fifth transistor that connects said fifth current source to said second diode bridge; a sixth transistor that connects said fifth current source to ground potential; a seventh transistor that connects said sixth current source to said second diode bridge; an eighth transistor that connects said sixth current source to ground potential; a third level-shift circuit that, when said fourth switch is turned ON, turns ON said fifth transistor and turns OFF said sixth transistor, and when said fourth switch is turned OFF, turns OFF said fifth transistor and turns ON said sixth transistor; and a fourth level-shift circuit that, when said fourth switch is turned ON, turns ON said seventh transistor and turns OFF said eighth transistor, and when said fourth switch is turned OFF, turns OFF said seventh transistor and turns ON said eighth transistor.

* * * * *